United States Patent [19]
Buchanan

[11] 3,942,162
[45] Mar. 2, 1976

[54] PRE-CONDITIONING CIRCUITS FOR MOS INTEGRATED CIRCUITS

[75] Inventor: John K. Buchanan, Tempe, Ariz.

[73] Assignee: Motorola, Inc., Chicago, Ill.

[22] Filed: July 1, 1974

[21] Appl. No.: 485,191

[52] U.S. Cl................................ 340/173 R; 307/238
[51] Int. Cl.².......................................... G11C 7/00
[58] Field of Search................. 340/173 R; 307/238

[56] References Cited
UNITED STATES PATENTS

| | | | |
|---|---|---|---|
| 3,771,147 | 11/1973 | Boll et al........................ | 340/173 R |
| 3,786,437 | 1/1974 | Croxon et al.................... | 340/173 R |
| 3,801,964 | 4/1974 | Palfi et al....................... | 340/173 R |

*Primary Examiner*—Stuart N. Hecker
*Attorney, Agent, or Firm*—Harry M. Weiss; Charles R. Hoffman

[57] ABSTRACT

An integrated circuit includes circuitry thereon which includes a sensor circuit which detects a change in one of the plurality of inputs to the integrated circuit and generates one or more pre-conditioning signals which control circuitry to set up voltages at various nodes in the integrated circuit to facilitate fast processing of data signals from inputs of the integrated circuit to outputs thereof. Embodiments of the sensor circuit include integrated memory circuits and integrated micro-processor circuits.

12 Claims, 8 Drawing Figures

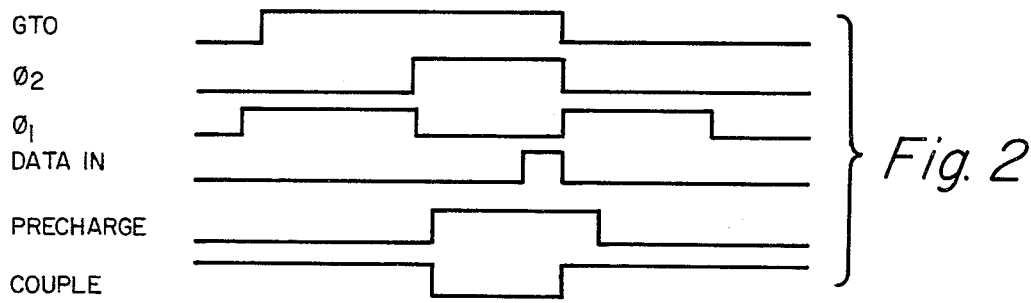
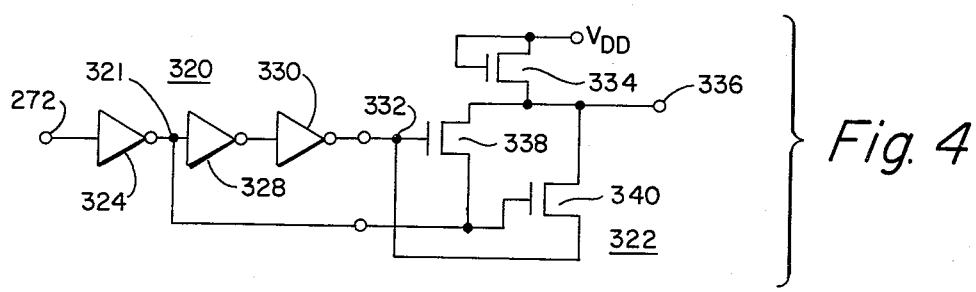
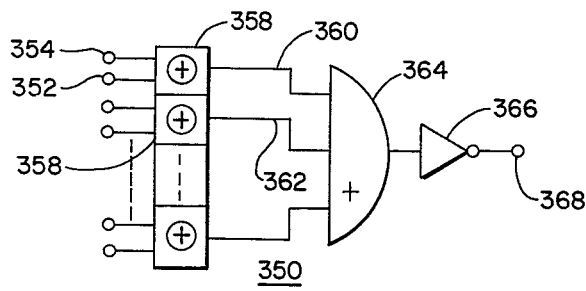
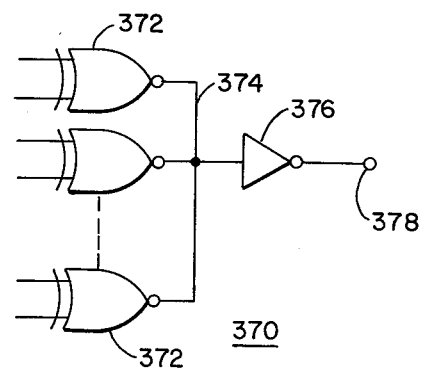
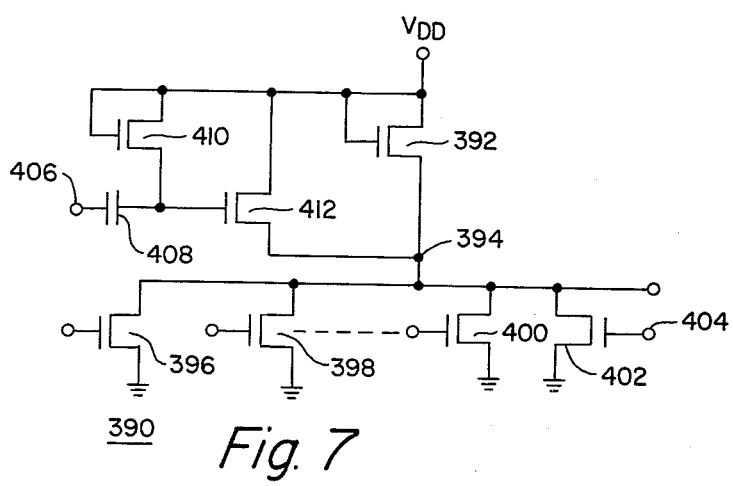
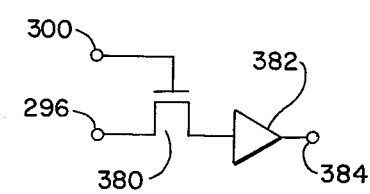

PRE-CONDITIONING CIRCUITS FOR MOS INTEGRATED CIRCUITS

BACKGROUND OF THE INVENTION

Integrated circuit memory circuits have been produced using MOS and bipolar technologies. The most complex memory circuits have been implemented using the MOS technology. The applications for MOS memory circuits, either random access memories (RAMs) or read only memories (ROMs) have required low cost and high speeds that strain capability of the MOS technology. To achieve the low cost, high density of memory elements on a chip is required. In order that such memory circuits be competitive, it has been necessary to minimize the amount of low density peripheral circuitry on the chip for address decoding, input/output circuitry and clock and timing signal generating circuitry. Therefore, circuits which have been commercially successful have required a plurality of externally generated clock signals and relatively simple decode input and output circuits. As a result, commercially successful MOS memory circuits produced to date have had peripheral circuitry which performed relatively simple decoding and input/output functions to allow interfacing with the memory array and have required close operating limits with respect to the timing of external clock signals, address signals and input/output signals. Relatively close tolerances of power supply voltages have been required to allow the circuit to operate within the timing specification ranges.

Micro-processor chips capable of receiving and executing multi-bit instructions and communicating with and addressing, writing in to and receiving data from external memory circuits have been implemented in MOS technologies. A considerable amount of "random logic" has been required to accomplish instruction decoding and execution of such micro-processor chips. This has been accomplished with individual combinational gates, shift registers and latches, all of which have a relatively low packing density in current MOS technology, but are the fastest means of accomplishing such functions. However, the low density and consequently large chip size required by this approach increases the cost and chip size of prior art micro-processor chips.

SUMMARY OF THE INVENTION

An object of this invention is to provide circuitry for pre-conditioning a node in an integrated circuit.

Another object of the invention is to provide a look-ahead circuit for pre-charging a node in an MOS integrated circuit.

Another object of the invention is to provide a look-ahead pre-charge circuit for an instruction decoder of an MOS integrated circuit micro-processor chip.

Briefly described, the invention, in one embodiment thereof is a memory circuit having nodes therein which must be pre-conditioned or pre-charged at a point in the memory cycle operation. Look-ahead precharge circuitry is provided which detects a change in any one of the plurality of address inputs and generates a signal to which the look-ahead pre-charge circuit is responsive in that it pre-conditions or pre-charges the node. In another embodiment of the invention, a look-ahead pre-charge circuit is provided to pre-charge certain nodes in an instruction decoder for an integrated circuit micro-processor chip. In this embodiment a signal is generated during execution of the previous instruction, indicating when the end of the previous instruction occurs. This signal is received and interpreted by a look-ahead pre-charge circuitry to generate a signal which initiates precharging of the particular nodes of the instruction decoder which are required to be precharged at the beginning of the present memory cycle.

BRIEF DESCRIPTION OF THE DRAWINGS

FIG. 2 is a timing diagram which is useful in describing the operation of the embodiment shown in FIG. 1.

FIG. 4 is a partial schematic diagram of an Exclusive NOR circuit which may be used in the embodiment of FIG. 3.

FIG. 5 is a logic diagram of a generalized version of a look-ahead pre-conditioning circuit.

FIG. 6 is a logic diagram of a look-ahead pre-conditioning circuit which may be used in the embodiment of FIG. 3.

FIG. 7 is a schematic diagram of a decode circuit having several nodes which require precharging and which may be used in the embodiment of FIG. 3.

FIG. 8 is a schematic diagram of a coupling circuit which may be utilized in the embodiment of FIG. 3.

DESCRIPTION OF THE INVENTION

Figure 1:
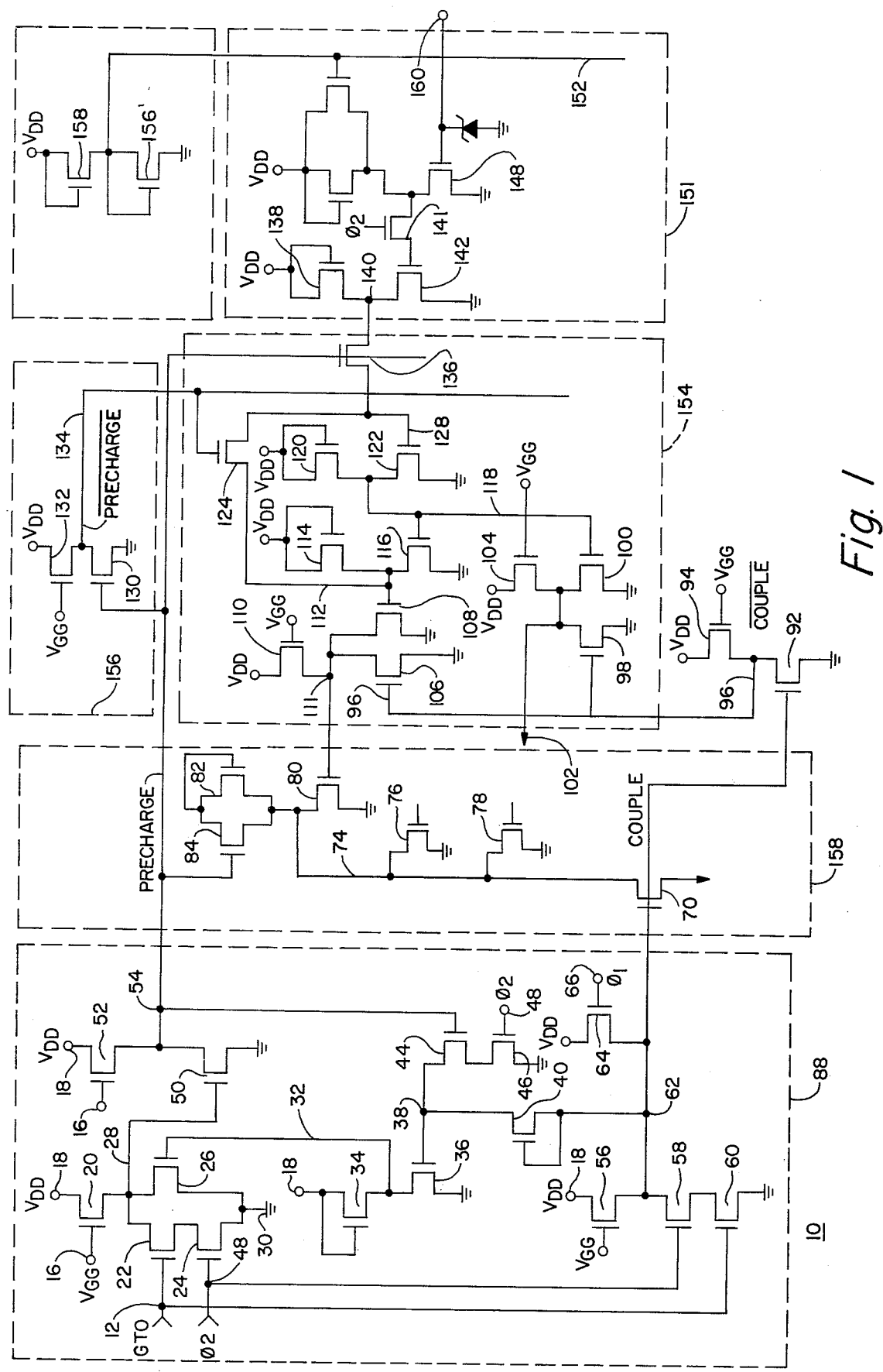
FIG. 1 is a schematic drawing of a preferred embodiment of the invention.

Referring to FIG. 1, which is a schematic diagram of a preferred embodiment of the invention, circuitry is depicted which anticipates the beginning of the subsequent cycle in an integrated circuit micro-processor. The micro-processor operates from two clock signals, $\phi 1$ and $\phi 2$. Circuitry in the micro-processor, not shown herein, generates a signal referred to herein as GTO during the last machine cycle during the execution of a particular instruction. Look-ahead precharge ROM 10 includes several definable sections, including input buffer 151, instruction register 154, precharge inverter 156, read only memory array 158, and precharge and coupling control circuit 88.

Precharge and coupling control circuit 88 includes a combinational gate including MOSFETs 20, 22, 24 and 26. Load MOSFET 20 is coupled between $V_{DD}$, node 18 and node 28, the output of said combinational gate. The gate of MOSFET 20 is connected to high voltage supply conductor 16, also designated $V_{GG}$. MOSFETs 22 and 24 are coupled in series between node 28 and ground conductor 30 and have their gates coupled, respectively, to GTO, node 12 and $\phi 2$, node 48. MOSFET 26 is connected between node 28 and ground conductor 30. This combinational gate drives the precharge inverter including MOSFETs 50 and 52. MOSFET 50 is connected between ground conductor 30 and PRECHARGE, and has its gate connected to node 28. Load MOSFET 52 is connected between $V_{DD}$ and PRECHARGE and has its gate connected to $V_{GG}$. The gate of MOSFET 26 is connected to node 32, which is the output of an inverter including MOSFET 34 and MOSFET 36. MOSFET 34 has its gate and drain connected to $V_{DD}$ and its source connected to node 32. MOSFET 36 is connected between ground conductor 30 and node 32 and has its gate connected to node 38. MOSFETs 44 and 46 are connected in series between node 38 and ground conductor 30. MOSFET 44 has its gate connected to node 54 and MOSFET 46 has its gate connected to φ2, node 48. Diode-connected MOSFET 40 has its source connected to node 38 and its gate and drain connected to node 62 which is the output of a NAND gate including MOSFETs 56, 58 and 60. MOSFET 56 is connected between $V_{DD}$ and node 62, and has its gate connected to $V_{GG}$. MOSFETs 58 and 60 are connected in series between ground conductor 30 and node 62 and have their gates connected, respectively, to φ2 and GTO. Precharge MOSFET 64 is connected between $V_{DD}$ and node 62 and has its gate connected to φ1, node 66.

ROM array 158 includes a plurality of columns of MOSFETs such as MOSFETs 76 and 78 and 80 all coupled between a respective column line, such as 74, and ground conductor 30. In FIG. 1 the gate electrodes of each of the MOSFETs in a given row are connected to the output of one of eight instruction register circuits, described hereinafter. Column line 74 is coupled by means of MOSFET 70 to control logic circuitry (not shown). The gate of each MOSFET 70, (and of each coupling MOSFETs, if there are a plurality of columns of memory devices) is connected to node 62. Each column line, such as 74, is also connected to a PRECHARGE MOSFET, such as MOSFET 84, which is connected between $V_{DD}$ and PRECHARGE, node 54. An additional pull-up MOSFET, such as MOSFET 82, having its gate and drain connected to $V_{DD}$ and its source connected to column conductor 74 is provided to maintain the precharged level as explained hereinafter. Each bit of the eight-bit instruction register includes an input latch including MOSFETs 136, 124, 120, 122, 114 and 116. Each bit of the instruction register also includes two two-input NOR gates, one input being connected to the conductor designated $\overline{COUPLE}$ and the other input of each being connected, respectively, to an output of the input latch. In essence, each bit of the eight-bit instruction register generates two output signals, one representing the logic state inputted to the circuit 10 and the other representing the complementary signal.

Each column of MOSFETs in the ROM array 158 represents an eight-bit NOR gate. Therefore, the entire circuit 10 is essentially an instruction decode circuit with a look-ahead precharge feature obtained by decoding a signal generated at the end of the execution of the previous instruction.

Referring to the above-mentioned latch circuit, coupling MOSFET 136 is connected between node 140 and node 128 and has its gate connected to PRECHARGE. MOSFET 124 is connected between node 112 and node 128 and has its gate connected to $\overline{PRECHARGE}$, which is generated at node 134 by precharge inverter 156. Precharge inverter 156 includes MOSFET 132 connected between $V_{DD}$ and node 134 and having its gate connected to $V_{GG}$ and also includes MOSFET 130 connected between node 134 and ground conductor 30 and having its gate connected to PRECHARGE, node 54. MOSFET 120 is connected between node 118 and $V_{DD}$ and has its gate connected to $V_{DD}$. MOSFET 122 is connected between node 118 and ground conductor 30 and has its gate connected to node 128. MOSFET 114 is connected between $V_{DD}$ and node 112 and has its gate connected to $V_{DD}$. MOSFET 116 is connected between ground conductor 30 and node 112 and has its gate connected to node 118.

The first NOR gate includes MOSFETs 106, 108 and 110. MOSFET 110 is connected between $V_{DD}$ and node 111, which is connected to the gate of MOSFET 80. MOSFETs 106 and 108 are connected in parallel between node 111 and ground conductor 30. MOSFET 108 has its gate connected to node 112, and MOSFET 106 has its gate connected to node 96, designated $\overline{COUPLE}$. $\overline{COUPLE}$ is generated by an inverter including MOSFETs 92 and 94. MOSFET 94 is connected between $V_{DD}$ and $\overline{COUPLE}$ and has its gate connected to $V_{GG}$. MOSFET 92 is connected between ground conductor 30 and node 96 and has its gate connected to node 62. The second NOR gate of the subject instruction register bit includes MOSFETs 98, 100 and 104. Load MOSFET 104 is connected between $V_{DD}$ and node 102 and has its gate connected to $V_{GG}$. MOSFETs 98 and 100 are connected between node 102 and ground conductor 130. MOSFET 100 has its gate connected to node 118 and MOSFET 98 has its gate connected to node 96. Input buffer 151 includes a first inverter having an input coupled to data input node 160 and having its output coupled by a φ2-clocked MOSFET 141 to the input of the second inverter including MOSFETs 138 and 142 and having an output 140 connected to MOSFET 136.

The operation of the embodiment of the invention described in FIG. 1 is best explained with reference to the timing diagram of FIG. 2. FIG. 2 includes waveforms of GTO, φ1, φ2, DATA IN, PRECHARGE, COUPLE, AND $\overline{COUPLE}$.

Referring to FIG. 2, GTO is the signal generated by the random logic circuitry at the end of the execution of the previous instruction. During the last part of GTO, φ2 occurs. During the concurrence of GTO and φ2, (referring to FIG. 1) MOSFETs 22 and 24 are turned on. During the previous φ1 pulse, node 62 was precharged to a high voltage level, and node 38 was charged to a threshold voltage below that voltage level through diode-connected MOSFET 40, turning MOSFET 36 on and causing node 32 to be low. Therefore, at the beginning of φ2 MOSFET 26 is off, as are MOSFETs 22 and 24, so node 28 is held at a high voltage equal to $V_{DD}$ by MOSFET 20. Consequently, initially MOSFET 50 is on and PRECHARGE, node 54, is near ground (assuming that the MOSFETs in FIG. 1 are N-channel). Thus, it is seen that during the concurrence of GTO and φ2, node 28 will be pulled close to ground as MOSFETs 22 and 24 are turned on. φ2 also turns on MOSFET 46. The voltage at node 28 turns MOSFET 50 off, so that load MOSFET 52 pulls PRECHARGE to $V_{DD}$ volts. Normally, the inverter including MOSFETs 52 and 50 is designed to have substantial drive capability, so that the rise time of PRECHARGE is fast in spite of substantial capacitive loading thereon. As PRECHARGE starts to rise, MOSFET 44 is turned on, and the charge on node 38 is discharged through MOSFETs 44 and 46, turning MOSFET 36 off. Then voltage on node 32 begins to rise, turning MOSFET 26 on. This aids MOSFETs 22 and 24 in holding node 28 at ground. At the end of the φ2 pulse and/or GTO, at least one of MOSFETs 22 and 24 is turned off. However, MOSFET 26 is designed so that it continues to hold node 28 near ground, and, consequently, PRECHARGE remains at $V_{DD}$ volts. PRECHARGE remains at $V_{DD}$ volts until the concurrence of the next φ1 pulse, at which time MOSFET 64 is turned on, charging up node 62, which in turn charges node 38 through diode-connected MOSFET 40. MOSFET 36 is thus turned on and node 32 is pulled toward ground, turning off MOSFET 26 and allowing load MOSFET 20 to charge up node 28. This in turn causes MOSFET 50 to be turned on, discharging PRECHARGE to ground.

It should be noted that the delay of the NAND gate including MOSFETs 56, 58 and 60 is much less than the delay through the combinational gate with MOSFET 20 as the load device and the inverter including MOSFETs 50 and 52. Thus, during the concurrence of GTO and $\phi 2$, couple MOSFET 70 and couple inverter MOSFET 92 are turned off before PRECHARGE starts to rise, thereby isolating the ROM matrix from external circuitry before the precharging event occurs. This also causes the NOR gate output to be grounded thereby turning off all the MOSFETs in the ROM matrix before precharging any of the column lines such as 74. Occurence of the next $\phi 1$ pulse rapidly turns on the coupling MOSFETs such as 70 and enables the instruction register outputs to turn on the selected MOSFETs in the ROM array to provide a relatively fast access time. The ROM outputs then rapidly reflect the decoded instruction from the data provided at the data input terminals, such as 160.

Figure 3:
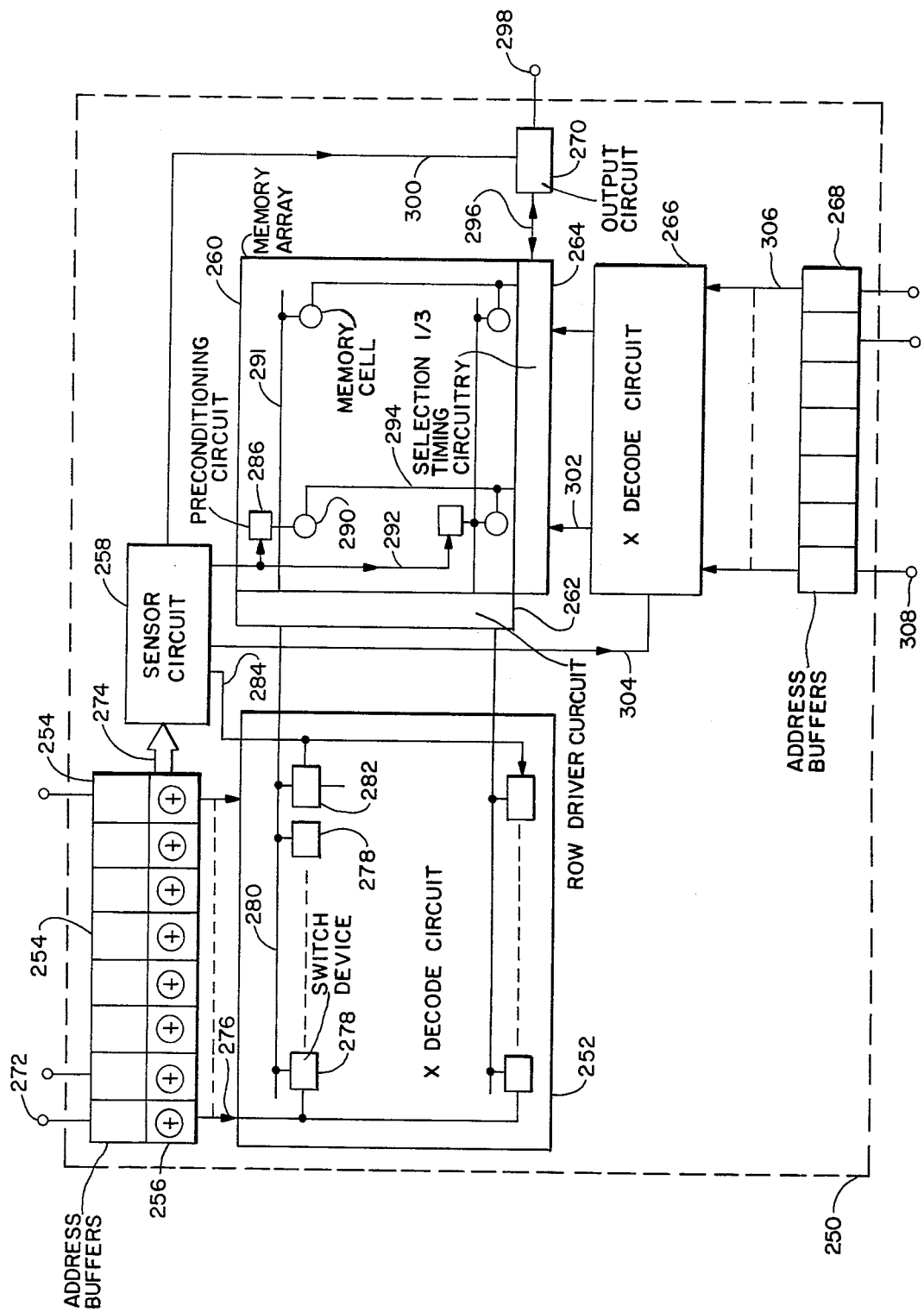
FIG. 3 is a block diagram of another embodiment of the invention.

According to the invention, the look-ahead PRECHARGE concept may utilize circuitry which detects a change at an input or at one of a plurality of inputs to a circuit and generates signals which may precharge certain nodes or otherwise precondition the circuit to facilitate faster signal processing, instead of utilizing a signal generated at the end of a prior instruction as in the previously described micro-processor. FIG. 3 is a block diagram of a memory circuit which could be either a random access memory (RAM) or a read only memory (ROM) which does not have supplied thereto a signal generated by related circuitry which anticipates the next cycle of operation. Memory circuit 250 in FIG. 3 includes memory element array 260, X decode circuitry 252, Y decode circuitry 266, output circuitry 270, X address input buffers 264, Exclusive OR type circuitry 256, sensor circuit 258, and Y address circuitry 268. Memory element array 260 includes a matrix of memory elements such as memory element 290 arranged in rows, each memory element in a given row being coupled to a row conductor 291. Each memory element in a given column is connected to at least one column conductor such as column conductor 294. Each row conductor such as 291 is also coupled to a pre-conditioning circuit 286. The row conductors such as 291 may be used in addressing a particular memory element. If there are more than one column conductor per column of memory elements, one of them may be used for addressing and the other may be used for data transmission to and from the selected memory element. The row conductors are connected to driver means 262, which in turn are driven by X decode array 252. Row driver means 262 may be buffer circuitry adapted to provide the desired timing and voltage magnitudes required in accessing a row of memory elements. The column conductors 294 are connected to circuitry 264 which may include column selection circuitry for selecting one of the column conductors which transmits data to and from the selected memory element. Circuitry 264 may also include driver circuitry for column conductors which address a memory element, to provide correct timing and voltage magnitude requirements to access a column of memory elements. The pre-conditioning circuits such as 286 are controlled by a signal on conductor 292 applied thereto by sensor circuit 258 described hereinafter. Typically, both row conductors such as 291 and column addressing conductors and column data conductors such as 294 may require precharging or other pre-conditioning prior to or early in the sequence of a memory cycle, such as a write cycle or a read cycle. X decode circuitry 252 performs the function of controlling row select circuitry 262 to select one of the row conductors in memory element array 260. Typically, row decode circuitry 252 includes one decode gate corresponding to each row of the memory element array 260, each decode gate including an output conductor 280, a plurality of switching devices or circuits 278, which in an MOS implementation may be merely MOSFETs coupled between conductor 280 and a ground conductor, and pre-conditioning devices or circuits such as 282 coupled to a preconditioning conductor 284 driven by sensor circuit 258 and coupled between node 280 and a voltage conductor a plurality of voltage conductors. Preconditioning circuit 282 may include a MOSFET coupled to a $V_{DD}$ voltage conductor and another MOSFET coupled to a ground conductor, and conductors 284 may include several voltage conductors, such as a precharge conductor for initially precharging node 280 and a clamp signal conductor for holding node 280 at ground voltage during a particular part of the memory cycle. Switching device means such as 278 are coupled to address and address complement lines such as 276 generated by input buffers 254 to decode one of the $2^N$ possible combinations of the input buffers, assuming there exist N input buffers. Each of the input buffers such as 254 also drives an Exclusive OR type circuit such as 256. By the term "Exclusive OR type circuit" it is meant either an Exclusive OR circuit or an Exclusive NOR circuit. Each of the Exclusive OR type circuits is coupled by means of a plurality of conductors 274 to sensor circuit 258.

As is well known, each Exclusive OR type circuit will generate an output signal in response to a change in the state of one of the inputs thereto. Each of the address input buffers 254 provides an output signal and typically also an output complement signal. A delay element may be included therein which has its input connected to one input of a corresponding Exclusive OR type circuit and whose output is connected to the other input of said Exclusive OR type circuit. The pulse width of the signal provided by the Exclusive OR type circuit is controlled by the delay of the delay circuit.

Sensor circuit 258 has as inputs the outputs of all the Exclusive OR type circuits and performs an OR (or a NOR) function on them so that an output signal is generated in response to a change in any of the address inputs such as 272. Of course, the width of the output signal is controlled by the above-mentioned delay.

Sensor circuit 258 includes various types of output circuits adapted to providing various preconditioning signals with the required voltages, pulse width, and delays required at various other points in the circuit to facilitate fast processing of data signals in the circuit paths between the selected memory element and the input/output circuit and also to facilitate fast decoding. For example, sensor circuit 258 may provide an output signal on conductor 300 which serves to control an output latch in output circuit 270 in response to an address change, so that output data remains valid even though a new memory cycle has been initiated by the address change.

Precharging signals may be applied to conductors 292 to precharge bit sense lines in memory element array 260. Conductors 284 and 304 may have precharging and/or preconditioning signals applied thereto by sensor circuit 258 derived from the output of the aforementioned OR gate to precharge the output nodes of the OR gates or to provide bootstrapping signals to generate fast, high magnitude output pulses for the selected decode gates. Further, signals may be generated by sensor circuit 258 which precondition the input buffers 254 and 268.

FIG. 5 illustrates the basic function of sensor circuit 258. In FIG. 5, circuit 350 depicts a plurality of Exclusive OR type circuits 358, each having first and second inputs 352 and 354 and an output 360. The various outputs 360 are all inputted to OR type gate 364 (which may be either an OR gate or a NOR gate). The output of the OR gate 364 is the basic preconditioning signal from which the above-mentioned precharge signal and other preconditioning signals are derived, by means of logic circuits such as inverter 366, and delay circuits and other known circuit techniques.

FIG. 6 is a diagram of a preferred implementation of the circuit in FIG. 5, which includes a plurality of Exclusive NOR gates 372. The outputs are tied together at node 374 to provide a so-called wired OR function. A change at any input of any of the Exclusive NOR gates then produces the basic preconditioning circuit at node 374, which may be inverted as by inverter 376 to provide a derived preconditioning signal at node 378.

FIG. 4 depicts a diagram of one embodiment of an input buffer connected to an MOS implementation of a simple Exclusive NOR circuit. The input buffer includes inverters 324, 328 and 330, connected in cascade. Address input 272 is connected to the input of inverter 324. Inverters 328 and 330 provide the above-mentioned delay. Nodes 326 and 332 are the inputs of the Exclusive NOR circuit 322, which includes load MOSFET 334 connected between $V_{DD}$ and output node 336. MOSFET 338 is connected between node 336 and node 326 and MOSFET 340 is connected between node 336 and node 332. Node 326 is a junction between the output of inverter 324 and the input of inverter 328 and node 332 is the output of inverter 330. When the logic level on address input 272 changes, the voltage at node 326 also changes and the voltage on node 332 changes to the same logic level as node 326, but is delayed by the delay of inverters 328 and 330. Thus, MOSFETs 338 and 340 are initially in the same state, i.e., either on or off. The change on node 372 causes one or the other of MOSFET 340 to turn either on or off, thereby causing the output voltage at node 336 to change. Then, after the signal at 326 has propagated through inverters 328 and 330, MOSFET 338 changes states.

FIG. 7 illustrates a decoder circuit which could be used, for example, in X decode circuit 252. Decoder 390 in FIG. 7 includes load MOSFET 392 connected between $V_{DD}$ and output node 394, which could be the same as row conductor 280 in X decode circuit 252 of FIG. 3. Decode gate 390 also includes MOSFETs 396, 398, 400 and 402 connected between output node 394 and a ground conductor. The gate electrodes of MOSFETs 396, 398, and 400 may be connected to various of the address and address complement lines generated by the address buffers such as 254 in FIG. 3 to decode the various combinations of the N address inputs. MOSFET 402 may, for example, be used to clamp the output of gate 390 to ground during precharge, and has its gate connected to node 404, which may be connected to one of conductors 384 from circuit 258. Gate 390 also includes a bootstrap circuit which includes MOSFETs 410 and 412 and capacitor 408. MOSFET 412 is connected between $V_{DD}$ and node 394 and has its gate connected to bootstrap capacitor 408 and diode-connected MOSFET 410, which is connected between the gate of MOSFET 412 and $V_{DD}$. The other terminal of bootstrap capacitor 408 is connected to node 406, which may be connected to another of preconditioning conductors 284 so as to boost the gate drive voltage of MOSFET 412 at the end of the precharge signal.

FIG. 8 depicts a coupling circuit which may, for example, be used in input/output circuit 270 of FIG. 3, and includes a coupling MOSFET 380 connected between conductor 296 and the input of output latch circuit 382. MOSFET 380 has its gate connected to conditioning conductor 300. The output of driver latch circuit 382 is node 384, which may be directly connected to data output node 298 in FIG. 3.

In the micro-processor embodiment of the invention, the data input signals could be Exclusive OR'ed in the same manner as the above-described memory circuit in FIG. 3 in order to generate the look-ahead preconditioning and/or precharging signal. However, the advantage to decoding the end of the previous instruction and generating a preconditioning signal therefrom provides an early preconditioning signal which normally would occur before any change in the data input terminals and thereby eases the design constraints on the preconditioning circuitry, allowing more time to precondition the various nodes in the instruction decoder, etch.

While the invention has been described in relation to several specific embodiments thereof, those skilled in the art will recognize that variations in placement and arrangement of elements may be made to suit varying requirements within the scope of the invention.

What is claimed is:

1. A digital data processing circuit having therein a precharge node and having a plurality of inputs comprising:
   circuit means coupled to said input responsive to a signal applied at said input;
   look-ahead precharge circuit means coupled between plurality of said inputs to said digital data circuit and said precharge node and also coupled to said circuit means for detecting a change in a logic level of any of said inputs and precharging said precharge node in response to said change in said logic level; and
   wherein said digital data processing circuit is a read only memory including address buffer circuits, row and column decode circuits, and a digital storage array and wherein said precharge node is a sense bus in said data storage array.

2. The read-only memory as recited in claim 1 wherein, one of said input is an address input of one of said address buffers.

3. The read-only memory as recited in claim 2 wherein said circuit means includes an Exclusive OR type circuit coupled to said input buffer and having its output coupled to a preconditioning circuit coupled to said precharge node.

4. The digital data processing circuit as recited in claim 1 wherein said digital data processing circuit is a random access memory including address buffer circuits, row and column decode circuits, and a data storage array and said precharge node is a sense bus in said data storage array.

5. The random access memory as recited in claim 4 wherein said input is an address input of one of said address buffers.

6. The random access memory as recited in claim 5 wherein said circuit means includes an Exclusive OR type circuit coupled to said input buffer and having its output coupled to a precharge circuit coupled to said precharge node.

7. The digital data processing circuit as recited in claim 1 wherein said digital data processing circuit is an instruction decoder including an instruction register and a decode array.

8. The instruction register as recited in claim 7 wherein said circuit means includes random logic circuitry for processing an instruction in said instruction register and said look-ahead precharge circuit means includes stage generator circuit means coupled to said random logic circuitry and to said precharge node and to said instruction register for qualifying entry of a new instruction and said instruction register.

9. The instruction decoder circuit as recited in claim 8 further including a precharge driver circuit coupled to said precharge node and coupled to the said stage generator circuit means.

10. The instruction decoder circuit as recited in claim 9 further including initiating circuit means for initializing the state of the stage generator circuit means coupled to said stage generator circuit means and to said random logic circuitry.

11. The instruction decoder as recited in claim 10 wherein said random logic circuitry is coupled to and drives a plurality of driver circuits which control computing circuitry, said instruction decoder and said computing circuitry being on an LSI semiconductor chip.

12. The instruction decoder as recited in claim 11 wherein said random logic circuitry includes a read-only memory array for performing random logic functions.

* * * * *